(12) United States Patent
He et al.

(10) Patent No.: US 12,212,117 B2
(45) Date of Patent: Jan. 28, 2025

(54) POWER MONITOR FOR SILICON-PHOTONICS-BASED LASER

(71) Applicant: Marvell Asia Pte Ltd, Singapore (SG)

(72) Inventors: Xiaoguang He, Diamond Bar, CA (US); Radhakrishnan L. Nagarajan, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

(21) Appl. No.: 18/495,848

(22) Filed: Oct. 27, 2023

(65) Prior Publication Data

US 2024/0063602 A1 Feb. 22, 2024

Related U.S. Application Data

(63) Continuation of application No. 17/191,410, filed on Mar. 3, 2021, now Pat. No. 11,804,692.

(51) Int. Cl.
*H01S 5/026* (2006.01)
*H01S 5/02* (2006.01)
*H01S 5/343* (2006.01)

(52) U.S. Cl.
CPC ............ *H01S 5/0264* (2013.01); *H01S 5/021* (2013.01); *H01S 5/3434* (2013.01)

(58) Field of Classification Search
CPC ........ H01S 5/021; H01S 5/0264; H01S 5/142; H01S 5/3434
See application file for complete search history.

(56) References Cited

U.S. PATENT DOCUMENTS

| | | | |
|---|---|---|---|
| 5,568,311 A | 10/1996 | Matsumoto | |
| 10,312,663 B2* | 6/2019 | Takabayashi | H01S 5/0687 |
| 2008/0002929 A1 | 1/2008 | Bowers | |
| 2008/0232409 A1* | 9/2008 | Yamazaki | G02B 6/12004 |
| | | | 372/20 |
| 2014/0079082 A1* | 3/2014 | Feng | H01S 5/101 |
| | | | 372/20 |
| 2016/0156149 A1* | 6/2016 | Takabayashi | H01S 5/142 |
| | | | 372/6 |
| 2017/0353008 A1* | 12/2017 | Sugiyama | H01S 5/142 |
| 2018/0261978 A1 | 9/2018 | Kurczveil | |
| 2019/0199062 A1* | 6/2019 | Ma | H01S 5/06821 |

FOREIGN PATENT DOCUMENTS

EP 2034571 A2 3/2009

OTHER PUBLICATIONS

European Search Report for European Application No. 22159747.9 dated Jul. 15, 2022.

* cited by examiner

*Primary Examiner* — Michael Carter (57) ABSTRACT

A laser device based on silicon photonics with in-cavity power monitor includes a gain chip, a reflector, and a photodiode. The gain chip is mounted on a silicon photonics substrate and is configured to emit light from an active region bounded between a frontend facet and a backend facet. The reflector is configured to reflect the light in a cavity formed between the reflector and the frontend facet through which a laser light is output. The photodiode is coupled to one or more waveguides in the cavity by a splitter disposed directly in an optical path between the reflector and a component positioned in the cavity. The photodiode is configured to measure power of light propagating through the cavity between the reflector and the component.

18 Claims, 5 Drawing Sheets

POWER MONITOR FOR SILICON-PHOTONICS-BASED LASER

CROSS-REFERENCE TO RELATED APPLICATIONS

The present disclosure is a continuation of U.S. patent application Ser. No. 17/191,410 filed on Mar. 3, 2021 (now U.S. Pat. No. 11,804,692, issued Oct. 31, 2023). The entire disclosure of the application referenced above is incorporated herein by reference.

BACKGROUND OF THE INVENTION

The present invention relates to optical communication techniques. More particularly, the present invention provides a laser device with an in-cavity power monitor based on silicon photonics platform.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

As science and technology are developed rapidly, processing speed and capacity of the computer increase correspondingly. The information transmission or reception using the traditional cable is limited to lower bandwidth as compared to what optical fiber provides. In the advent of Information Age, traditional electrical communication has been largely replaced by fiber-optic communication which provides much higher bandwidth and much longer distance transmission. An optical communication system includes both electrical devices and optical devices, devices for converting electrical signal and optical signal back and forth, and devices for processing these signals.

With the advances of optical communication technology combined with matured semiconductor CMOS manufacturing technology, applications driven by the market demand on increasing bandwidth and decreasing package footprint, more intensive effort and progress have been seen in the development of electro-optic communication devices in silicon-photonics platform. For example, semiconductor laser devices including wavelength tuner formed in silicon photonics platform have been developed and applied in advanced electro-optic modules. However, output power of the silicon-photonics-based laser drops over time due to various degradation mechanisms which requires a monitor photodiode (MPD) as a detector to determine the output power of the lasers so that the laser driving circuit can compensate the laser output power drop by increasing laser driving current. Conventionally, an MPD is disposed outside the front facet of the laser device for monitoring laser output power, which requires extra mean splitter, involves more packaging issues, and suffers in stability over time. Improved design for setting an in-cavity power monitor for the silicon-photonics-based laser is desired.

BRIEF SUMMARY OF THE INVENTION

The present invention relates to optical telecommunication techniques. One aspect of the present invention provides a laser device with an in-cavity power monitor for based on silicon photonics platform. More particularly, the present invention provides a monitor photodiode built inside a silicon-based wavelength tuner as part of a laser oscillation cavity extended from a backend of a gain chip, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides a laser device based on silicon photonics with an in-cavity power monitor. The laser device includes a gain chip mounted on a silicon photonics substrate and configured to emit light in an active region bounded between a frontend facet with low reflectivity and a backend facet with anti-reflective characteristics. Additionally, the laser device includes a wavelength tuner formed with waveguides in the silicon photonics substrate optically coupled to the backend facet to receive light from the gain chip and configured to have a reflector with high reflectivity to reflect the light in an extended cavity formed with the frontend facet through which a laser with a tuned wavelength and amplified power is outputted. Furthermore, the laser device includes a photodiode formed in the silicon photonics substrate and coupled to the waveguides in the extended cavity right in front of the reflector to measure power of light thereof.

In an alternative embodiment, the present invention provides a method for forming silicon-photonics-based laser device with a power monitor inside a laser cavity. The method includes a step of providing a silicon substrate with embedded waveguides. The method further includes a step of forming a wavelength tuner based on the embedded waveguides including at least a reflector configured with high reflectivity. Additionally, the method includes a step of forming a splitter waveguide in the silicon substrate next to a section of the embedded waveguides right in front of the reflector. The method further includes a step of forming a photodiode in the silicon substrate to couple with the splitter waveguide. Furthermore, the method includes a step of providing a semiconductor laser gain chip having an active region bounded between a frontend in low reflectivity and backend with anti-reflective characteristics. The method further includes a step of mounting the semiconductor laser gain chip to the silicon substrate to have the backend coupled to the wavelength tuner to form an extended cavity between the frontend and the reflector. Moreover, the method includes a step of measuring power of light right in front of the reflector by the photodiode to monitor output power of laser out of the frontend.

The present invention achieves these benefits and others in the context of known technology of semiconductor laser based on silicon photonics platform. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to optical telecommunication techniques. One aspect of the present invention provides a laser device with an in-cavity power monitor for based on silicon photonics platform. More particularly, the present invention provides a monitor photodiode built inside a silicon-based wavelength tuner as part of a laser oscillation cavity extended from a backend of a gain chip, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels inner, outer, left, right, frontend, backend, forward, backward, top, bottom, have been used for convenience purposes only and are not intended to imply any particular fixed direction. Instead, they are used to reflect relative locations and/or directions between various portions of an object.

Figure 1:
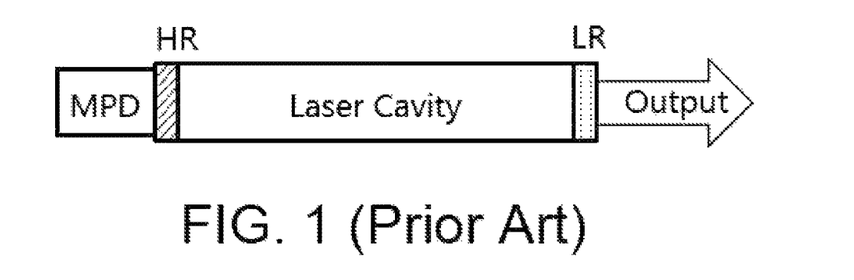
FIG. 1 is a schematic diagram of a conventional laser device with a power monitor coupled from outside of the cavity backend.
Figure 2:
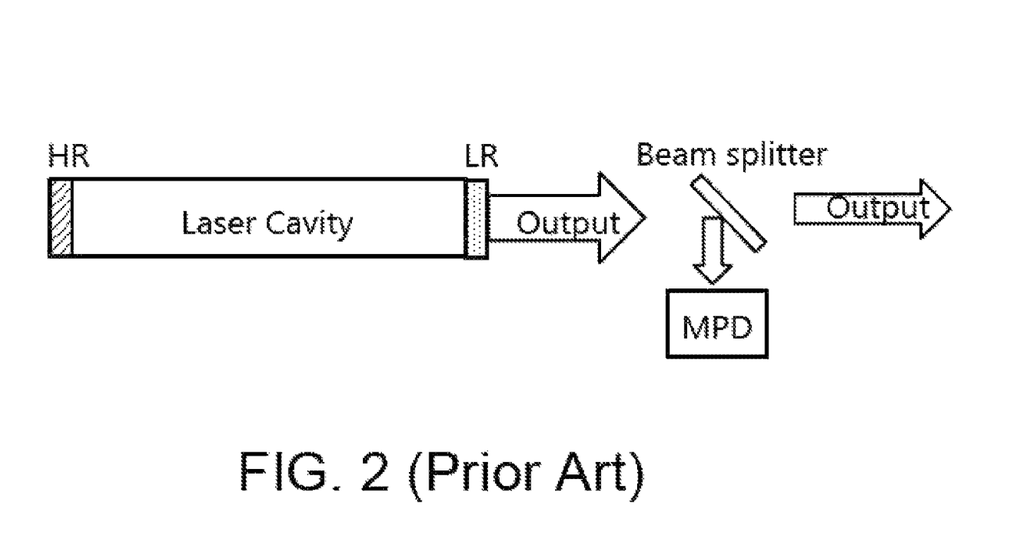
FIG. 2 is a schematic diagram of a conventional laser device with a power monitor set with a splitter at outside of the cavity frontend.

Laser operation need control the output power. The output power of a laser device drops over time due to various degradation mechanisms. Monitor photodiode (MPD) is often used as a detector to determine the output power of the laser device so that a driving circuit can compensate the laser output power drop by increasing driving current accordingly. Conventionally, the MPD is disposed outside laser cavity as an external device to monitor the laser output power. FIG. 1 shows a schematic diagram of a conventional laser device with a power monitor coupled from outside of the cavity backend. The power monitor is a MPD coupled to the backend facet of the regular laser device, such as III-V semiconductor-based laser, for directly detecting power level thereof without using extra power splitter. However, for silicon-based laser the cavity backend usually is not accessible. Also, the detected power by the backend-coupled MPD versus real output power can vary or become unreliable if the coupling efficiency degradation occurs. FIG. 2 shows another scheme of a conventional laser device with a power monitor set with a splitter at outside of the cavity frontend. This scheme can detect actual output power of the laser no matter what it is conventional III-V laser or silicon-based laser and how it degrades in any way. However, it reduces final output power as it requires extra component like a beam splitter or tap coupler to direct a small portion (typically 5%) of the output power to the MPD. This also causes complexity in laser device packaging due to the extra component and poorer reliability with additional potential degradation mechanism.

Figure 3A:
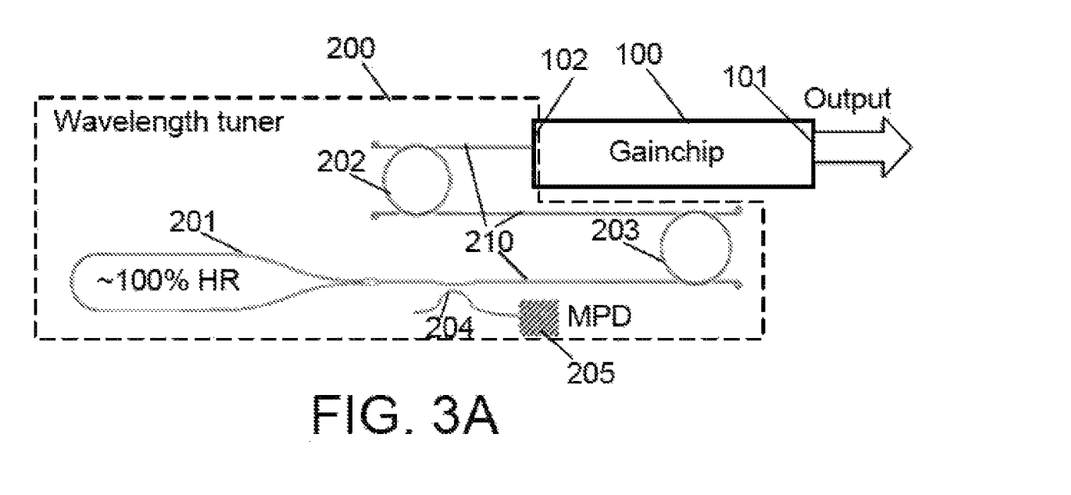
FIG. 3A is a schematic diagram of a power monitor set inside an extended cavity of a silicon-photonics-based laser device according to an embodiment of the present invention.

In an aspect, the present disclosure provides an innovated way for having a power monitor built inside an extended laser cavity of a silicon-photonics-based laser device. FIG. 3A is a schematic diagram of a power monitor set inside an extended cavity of a silicon-photonics-based laser device according to an embodiment of the present invention. This diagram is merely an example, which should not unduly limit the scope of the claims. One of ordinary skill in the art would recognize many variations, alternatives, and modifications. As shown, the silicon-photonics-based laser device includes a gain chip 100 configured as a linear gain medium between a frontend 101 and a backend 102. The frontend 101 is configured with a low-reflectivity (<10%) facet as a light output port. The backend 102 is configured with an anti-reflective facet and is coupled to a waveguide-based wavelength tuner 200. Optionally, the waveguide-based wavelength tuner 200 includes multiple sections of waveguides in different shapes mutually coupled to each other formed in part of a silicon photonics chip. The gain chip 100 is a separately fabricated chip that is flip-mounted on surface of the silicon photonics chip with optical alignment formed between a section of the waveguides and the backend facet of the gain chip. Optionally, the waveguides are made from silicon (Si) and/or silicon-nitride (SiN) or other suitable semiconductor material embedded in the silicon photonics chip.

Referring to FIG. 3A, the gain chip 100 is made by semiconductor-based materials configured with an active region in multi-quantum-well heterostructure between the facet at the frontend 101 and the facet at the backend 102. Depending on working wavelength spectrum, different semiconductor materials including one or more compound semiconductors or a combination of InAsP, GaInNAs, GaInAsP, GaInAs, and AlGaInAs may be employed for forming the multi-quantum-well heterostructure sandwiched by a n-type electrode and a p-type electrode to form a diode chip. The diode chip is, when it is driven by a bias current from a driver circuit, able to generate stimulated light emission. The wavelength tuner 200 is configured to receive the light from the stimulated emission in the linear gain medium 100 through the facet of the backend 102 and to generate an interference spectrum with a sharp central wavelength and suppressed side modes over a wide-band tunable range. Optionally, the wavelength tuner 200 is a silicon-based optical filter device that is integrated directly into a silicon photonics chip to couple with other built-in silicon photonics devices such as wavelength locker, splitter/combiner, modulator, or photodetector, etc. or optically coupled to other chip such as the gain chip mounted on surface of the silicon photonics chip.

In an embodiment, the waveguide-based wavelength tuner 200 is a resonant ring tuner including a pair of ring-shaped waveguides, a first ring 202 and a second ring 203, a few linear sections of wire waveguides 210, and a loop reflector 201, made by Si or SiN material fabricated in a silicon substrate via CMOS processing technology. Referring to FIG. 3A, the first ring 202 is connected via a linear section of waveguide 210 coupled to the backend 102 and is connected to the second ring 203 via another linear section of waveguide 210. The second ring 203 is further connected to the loop reflector 201 via yet another linear section of waveguide 210. The first ring 202 and the second ring 203 are made with different diameters to allow different resonant frequencies for the light traveling forward and backward in the waveguide path of the wavelength tuner 200. The loop reflector 201 is configured as a mirror yielding greater than 90% up to nearly 100% reflection to the light so that the light with its wavelength being tuned by the wavelength tuner 200 can return to the gain chip 100 with extra loss except tuner path loss. This effectively extends the laser cavity beyond the gain medium length, making the cavity with a tuner section in the wavelength tuner 200 and an amplification section in the gain chip 100. Optionally, the wavelength tuner 200 is a wide-band tuner capable of tuning wavelength over entire C band or O band for optical communication applications.

Figure 3B:
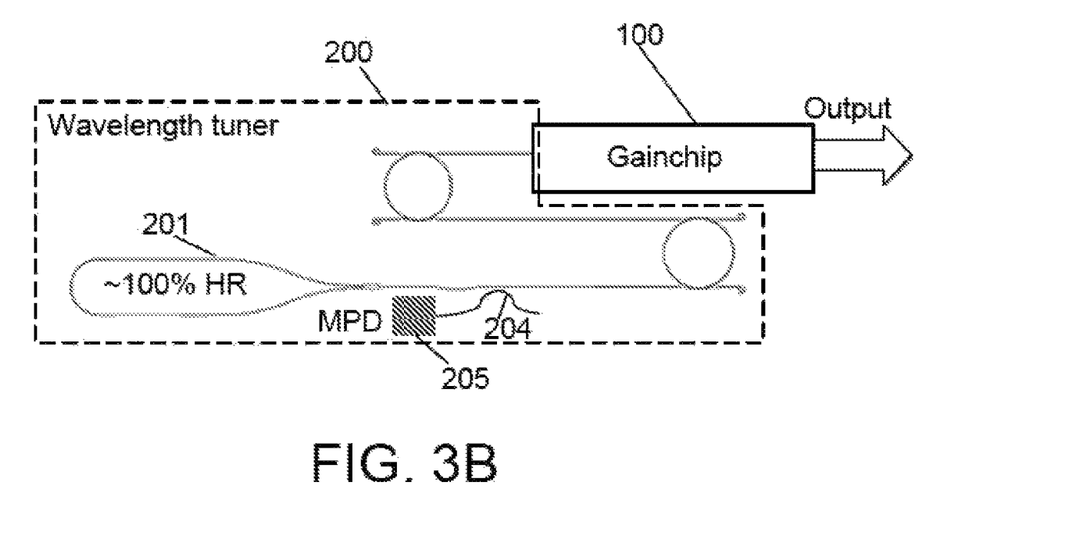
FIG. 3B is a schematic diagram of a power monitor set inside an extended cavity of a silicon-photonics-based laser device according to an alternative embodiment of the present invention.

Referring to FIG. 3A, an MPD 205 can be coupled into the wire waveguide right before the loop reflector 201 as part of the wavelength tuner 200. Specifically, the MPD 205 is coupled via a branch of a splitter waveguide 204. The splitter waveguide 204 is also a silicon-based waveguide which can be formed next to the linear section of waveguide at a close distance to have a small percentage of optical power being split into the branch. The distance between the splitter waveguide 204 and the linear section of waveguide and the length of the splitter waveguide 204 can be controlled well enough to determine the small percentage of power splitting. Both the formation of the splitter waveguide and the MPD coupled to one splitting branch with well-controlled split ratio can be easily done in matured CMOS process. Optionally, the MPD 205 is a germanium or silicon-germanium photodiode which can be fabricated in a same CMOS process of making the silicon-based wavelength tuner 200 in a silicon substrate. With this disposition setting of the power monitor, the MPD 205 can accurately monitor the optical power of light traveling to the right (of the tuner path) at a location right before the loop reflector 201. FIG. 3B shows an alternative disposition setting of the power monitor set inside an extended cavity of a silicon-photonics-based laser device according to another embodiment of the present invention. Referring to FIG. 3B, the MPD 205 is just coupled to another splitting branch of the splitter waveguide 204 and is able to monitor the optical power of the light traveling to the left (towards the loop reflector) at the location right before the loop reflector 201 of the wavelength tuner 200. Under the condition with matured Si CMOS processing technology that the loop reflector 201 can be formed to yield up to 100% reflectivity, the optical power of the light traveling in either one of the two directions is the same, so that the MPD 205 in FIG. 3B can function the same as that in FIG. 3A. Optionally, two MPDs can be respectively coupled to the two splitting branches for monitoring the laser power. In general, the MPD as a power monitor is formed inside an extended laser cavity of the silicon-photonics-based laser device. In other words, the present invention provides a silicon-photonics-based laser device with self-power-monitoring photodiode.

Figure 4:
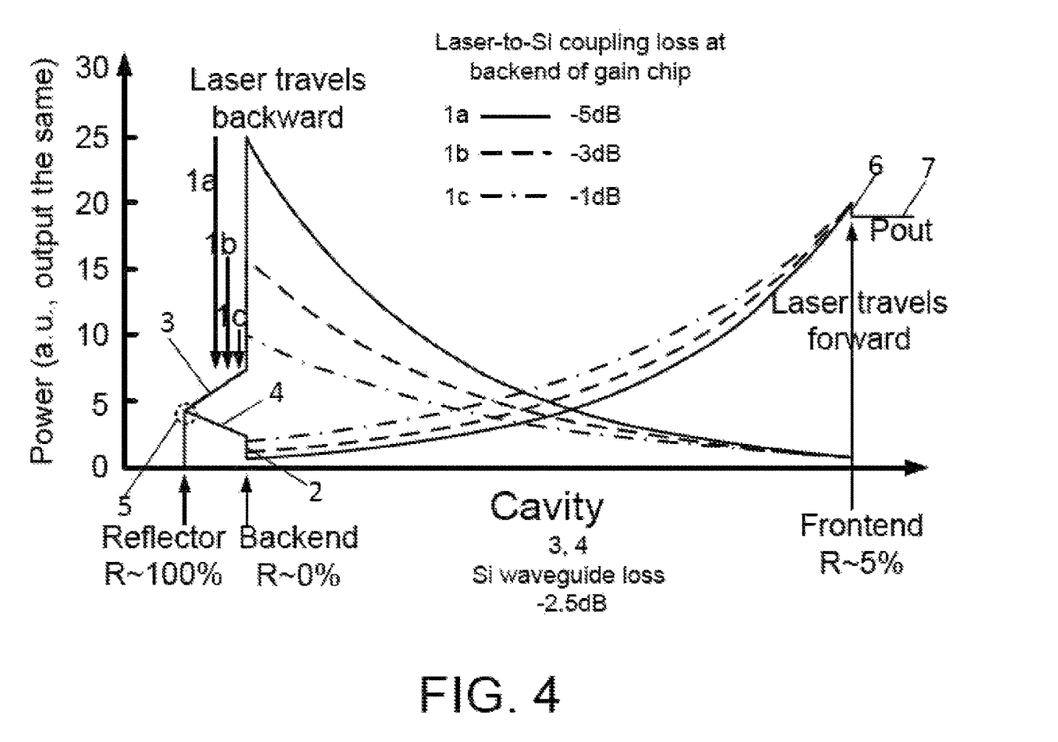
FIG. 4 is an exemplary plot of monitored power versus laser output power at various laser-to-Si coupling efficiency levels according to an embodiment of the present invention.

Additionally in the embodiment, the MPD formed inside the laser cavity shown in FIG. 3A and FIG. 3B can serve the power monitor for monitoring output power of the silicon-photonics-based laser device. This is established by having a fixed correlation between the light power right at the loop reflector measured by the MPD and the output power of the laser device at the laser output port. In an embodiment, the fixed correlation between the MPD measured power and the output power is independent from optical coupling loss variation between the laser in the gain chip and in silicon waveguide. In an embodiment, the fixed correlation between the MPD measured power and the output power is only depended upon the reflectivity values of the frontend of the gain chip and the loop reflector of the wavelength tuner but independent from device loss and coupling loss. FIG. 4 an exemplary plot of monitored power versus laser output power at various laser-to-Si coupling efficiency levels according to an embodiment of the present invention. This diagram is merely an example, which should not unduly limit the scope of the claims. One of ordinary skill in the art would recognize many variations, alternatives, and modifications. As shown, the power of laser light is plotted in an extended cavity between the frontend of the gain chip and the reflector in the Si-waveguide-based wavelength tuner under an assumption that the wavelength tuner is a Si-based waveguide and the power loss for the light to be coupled between the Si-waveguide of the wavelength tuner and the gain chip is a constant ratio, e.g., −2.5 dB. This is simply referred to laser to Si coupling loss. Two parts of the power curves are plotted respectively for one path traveling forward in a direction from the reflector in the Si-waveguide-based wavelength tuner through the backend facet of the gain chip to the frontend of the gain chip and an opposite path traveling backward out of backend with anti-reflective coating of the gain chip to the reflector in the Si-waveguide-based wavelength tuner. In the embodiment, it is assumed that the reflector is characterized by ~100% reflectivity (R), the backend facet is characterized by R~0% due to an anti-reflective coating, the frontend facet is characterized by R~5% (optionally less than 10%) due to a low-reflectivity costing, and there is a laser-to-Si coupling loss optionally variable between the Si-waveguide-based wavelength tuner and the laser in the gain chip. The MPD is disposed at a position 5 right in front of the reflector in a setting shown in FIG. 3B to measure power of laser light traveling backward through the backend of the gain chip into the wavelength tuner.

Referring to FIG. 4, the MPD measured laser power is shown to have a fixed correlation with the output power Pout of the laser at the output port of the gain chip no matter what the laser-to-Si coupling loss is. The fixed correlation is only depended upon the optical reflectivity at the two ends of the extended cavity, i.e., the frontend of the gain chip and the reflector but independent from device loss and coupling loss. For various laser-to-Si coupling losses, e.g., −5 dB, −3 dB, −1 dB, the power curves are plotted with dash-dot line, dashed line, and solid line, respectively. The power of laser light traveling backward will firstly suffer different losses at the backend with R~0% of the gain chip indicated by different vertical drops 1a, 1b, 1c, respectively. Once the laser light enters the Si-waveguide-based wavelength tuner, it will further suffer the Si waveguide loss 3 to reach the reflector with R~100%, which is a constant linearly depended upon the length of the optical path in the Si-waveguide-based wavelength tuner. Right in front the reflector the MPD is formed at a position 5 to measure the power, which is a fixed value. As the light is reflected up to ~100% by the reflector and travels forward from the position 5, the power of light firstly suffers the Si waveguide loss 4 of the Si-waveguide-based wavelength tuner before reaching the backend of the gain chip. The Si waveguide loss 4 should be the same as the Si waveguide loss 3 in −2.5 dB. While, as the light enters the gain chip from the Si-waveguide-based wavelength tuner through the backend, the power of light will further suffer corresponding laser-to-Si coupling losses 2 with different values, −5 dB, −3 dB, −1 dB, respectively. However, no matter what the power of light is at this position, it will be amplified by the gain chip to a same power level fixed at the frontend. Since the frontend is characterized by a low reflectivity R~5% (optionally less than 10%), the output power Pout of the laser light out of the frontend at the position 7 suffers a little loss 6. For any variation in the laser-to-Si coupling loss, the MPD measured power at the position 5 inside the (extended) cavity has a fixed correlation with the output power Pout at the position 7 out of the frontend of the gain chip. The fixed correlation is only depended upon the optical reflectivity at the two ends of the extended cavity, i.e., the frontend of the gain chip and the reflector of the Si-waveguide-based wavelength tuner but independent from device loss and coupling loss. Therefore, the MPD disposed in the cavity is able to accurately monitor output power Pout of the laser device.

Figure 5:
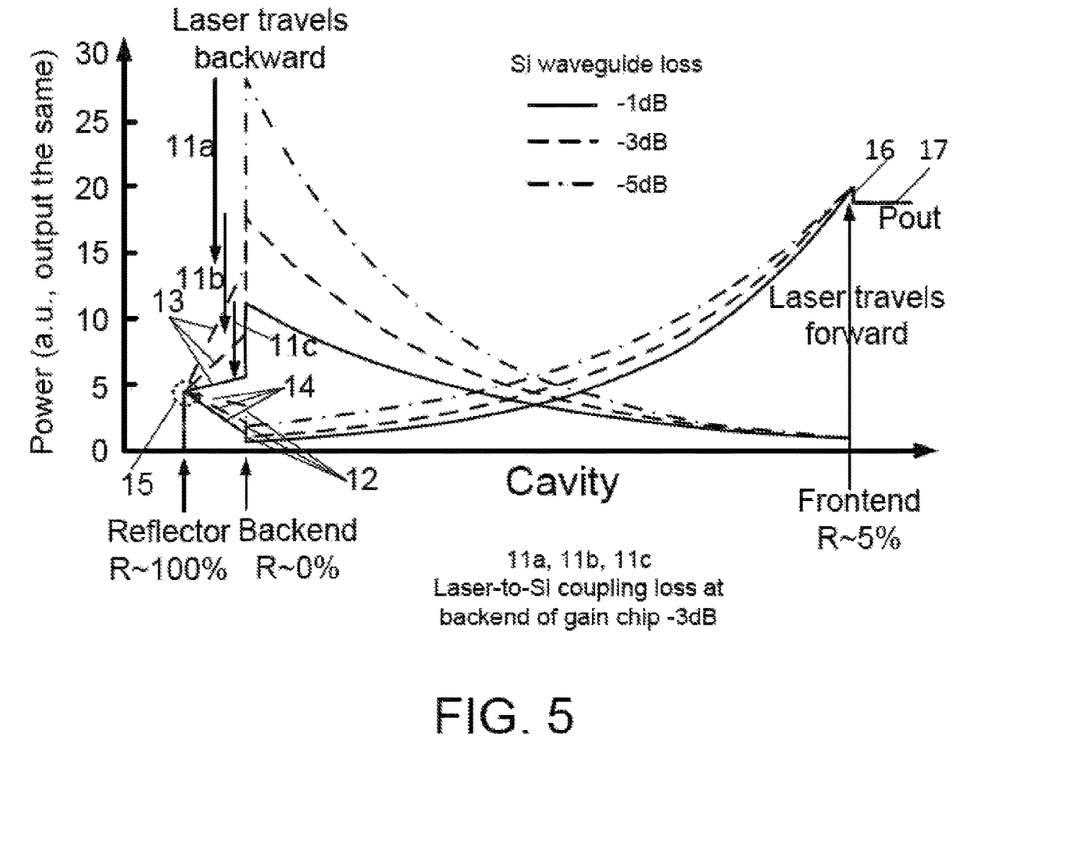
FIG. 5 is an exemplary plot of monitored power versus laser output power at various Si waveguide loss levels according to an embodiment of the present invention.

In another embodiment, the correlation between the MPD measured power and the output power is independent from tuner loss variation in the silicon waveguide coupled to the backend of the gain chip. FIG. 5 shows an exemplary plot of monitored power versus laser output power at various Si-based waveguide loss levels according to an embodiment of the present invention. This diagram is merely an example, which should not unduly limit the scope of the claims. One of ordinary skill in the art would recognize many variations, alternatives, and modifications. As shown, the power of laser light is plotted in an extended cavity between the frontend of the gain chip and the reflector in the Si-waveguide-based wavelength tuner under an assumption that the laser-to-Si coupling loss is a constant ratio of −3 dB. Similar to FIG. 4, two parts of the power curves are plotted respectively for one path traveling forward in a direction from the reflector in the Si-waveguide-based wavelength tuner through the backend facet of the gain chip to the frontend of the gain chip and an opposite path traveling backward out of backend with anti-reflective coating of the gain chip to the reflector in the Si-waveguide-based wavelength tuner. In the embodiment, it is assumed that the reflector is characterized by a high reflectivity R >90% up to ~100%, the backend facet is characterized by R~0% due to an anti-reflective coating, the frontend facet is characterized by R~5% (or less than 10%) due to a low-reflectivity costing, and the Si-waveguide-based wavelength tuner has a loss optionally variable. The MPD is disposed at a position 15 right in front of the reflector in a setting shown in FIG. 3B to measure power of laser light traveling backward through the backend of the gain chip into the wavelength tuner.

Referring to FIG. 5, the MPD measured laser power is shown to have a fixed correlation with the output power Pout of the laser at the output port of the gain chip no matter what the Si-based waveguide loss is. The fixed correlation is only depended upon the optical reflectivity at the two ends of the extended cavity, i.e., the frontend of the gain chip and the reflector. For various Si-based waveguide losses, e.g., −5 dB, −3 dB, −1 dB, the power curves are plotted with dash-dot line, dashed line, and solid line, respectively. The power of laser traveling backward is amplified by the gain chip and will firstly suffer a laser-to-Si coupling loss, which is a fixed −3 dB, at the backend with R~0% of the gain chip indicated by different vertical drops 11a, 11b, 11c, respectively. Once the laser light enters the Si-waveguide-based wavelength tuner, it will further suffer the Si-based waveguide loss 13 with different values of −5 dB, −3 dB, −1 dB, respectively, to reach the reflector with R~100%. Right in front the reflector the MPD is formed at a position 15 to measure the power, which is a fixed value. As the light is reflected almost ~100% from the reflector and travels forward from the position 15, the power of light firstly suffers the Si-based waveguide loss 14 with the corresponding different values of −5 dB, −3 dB, −1 dB, respectively, before reaching the backend of the gain chip. While, as the light enters the gain chip from the Si-waveguide-based wavelength tuner through the backend, the power of light will further suffer the laser-to-Si coupling loss 12 with the value of −3 dB. However, no matter what the power of light is at this position, it will be amplified by the gain chip to a same power level fixed at the frontend. Since the frontend is characterized by a low reflectivity R~5% (optionally less than 10%), the output power Pout of the laser light out of the frontend at the position 17 suffers a little loss 16. For any variation in the Si-based waveguide loss, the MPD measured power at the position 15 inside the (extended) cavity has a fixed correlation with the output power Pout at the position 17 out of the frontend of the gain chip, which is independent from device loss and degradation but only dependent on reflectivity values at two ends of the extended laser cavity, i.e., a reflector with high reflectivity and a frontend facet as output port with low reflectivity. Once again it shows that the MPD disposed in the cavity is able to accurately monitor output power Pout of the silicon-photonics-based laser device.

Figure 6:
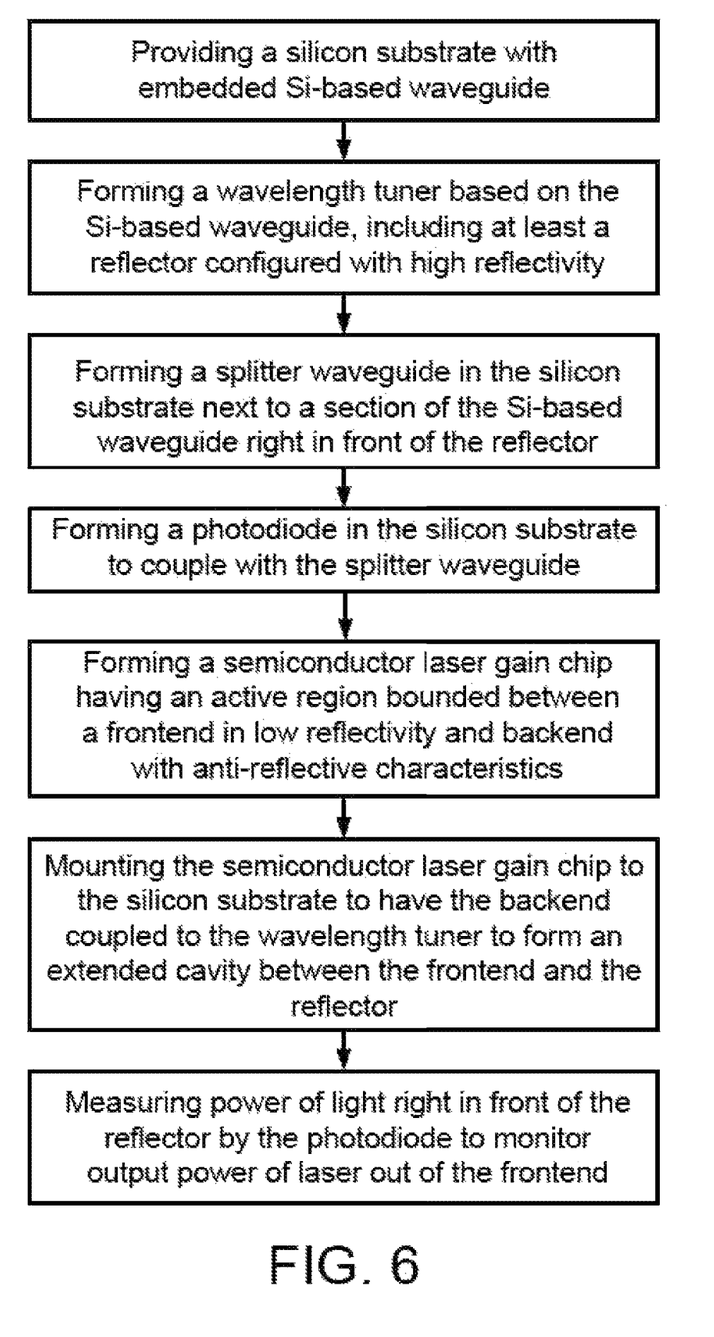
FIG. 6 is a flow chart illustrating a method for forming a silicon-photonics-based laser device with a power monitor inside the laser cavity according to an embodiment of the present invention.

In another aspect, the present invention provides a method for forming a silicon-photonics-based laser device with a power monitor inside the laser cavity. The method is based on a monitor photodiode disposed inside the laser cavity that is extended from the backend of the gain chip of the silicon-photonics-based laser device. FIG. 6 is a flow chart illustrating a method for forming a silicon-photonics-based laser device with a power monitor inside the laser cavity according to an embodiment of a present invention. This diagram is merely an example, which should not unduly limit the scope of the claims. One of ordinary skill in the art would recognize many variations, alternatives, and modifications. As shown, the method includes a step of providing a silicon substrate with embedded waveguides. Optionally, the silicon substrate is a silicon-on-insulator (SOI) substrate. Optionally, the silicon substrate is part of a silicon photonics die in a silicon wafer. Optionally, the waveguides are wire-shaped waveguides made from silicon or silicon nitride embedded in the silicon substrate. Optionally, the waveguides include some linear sections, some circular-shaped rings, some loop sections. The embedded waveguides in the silicon substrate can be utilized for forming various passive or active photonics components including combiner, splitter, coupler, modulator, detector, filter, etc. Further, the method includes a step of forming a wavelength tuner based on the embedded waveguides including at least a reflector. Optionally, the step of forming the wavelength tuner based on the embedded waveguides includes a sub-step of fabricating a resonant ring filter via a CMOS process in a die of the silicon substrate. The sub-step includes forming two rings from the embedded waveguide in circular shape with different diameters, forming the reflector from a loop shaped section of the embedded waveguides, and connecting the two rings mutually or connecting one of the two rings with the reflector via different linear sections of embedded waveguide. The reflector in loop shape is configured with high reflectivity. Under the matured Si CMOS processing technology, it is fairly trivial to achieve the high reflectivity value of greater than 90%. Optionally, the reflector in loop shape is configured with a high reflectivity up to 100%.

Additionally, referring to FIG. 6, the method includes a step of forming a splitter waveguide in the silicon substrate next to a section of the embedded waveguides right in front of the reflector. Optionally, the splitter waveguide is a separate Si waveguide next in a close distance in parallel to the linear section of the embedded waveguides in part of the wavelength tuner right in front of the reflector. Optionally, the splitter waveguide has two ports, each being able to couple a small portion (~5%) of the optical power from the section of embedded waveguide. The method further includes a step of forming a photodiode in the silicon substrate to couple with the splitter waveguide. Optionally, the photodiode is a germanium photodiode embedded in the silicon substrate. Optionally, the photodiode is a silicon-germanium photodiode with high-speed detection ability. Optionally, the splitter waveguide, the photodiode, and the wavelength tuner are all formed in one silicon photonics die via a same CMOS process performed in the silicon substrate. Optionally, the photodiode can be configured to couple with either one of two splitting ports. Under the condition that the reflector is configured as a mirror with nearly 100% in reflectivity, the photodiode can be coupled with either splitting port of the splitter waveguide to yield a same power measurement for either the light traveling forward from the reflector towards the gain chip or the light traveling backward in opposite direction.

Furthermore in the embodiment, the method includes a step of providing a semiconductor laser gain chip having an active region bounded between a frontend in low reflectivity and backend with anti-reflective coating. Optionally, the semiconductor laser gain chip is a separately manufactured chip with the active region being configured as a multi-quantum-well heterostructure sandwiched in a PN junction diode. The active region is made by semiconductor material that is able to generate light luminescence driven by bias current applied across the PN junction diode. The active region also forms a natural optical cavity serving as an amplification medium between the frontend facet and a backend facet. Optionally, the frontend facet is characterized by a low reflectivity <10% and the backend facet is characterized by anti-reflection optical property for a wide range of wavelengths. Optionally, the reflectivity of the frontend is about 5%. Optionally, the reflectivity of the backend is about 0%.

Referring to FIG. 6, the method further includes a step of mounting the semiconductor laser gain chip to the silicon substrate to have the backend optically coupled to the wavelength tuner to form an extended cavity between the frontend of the gain chip and the reflector of the wavelength tuner. Optionally, the backend facet is coupled to a linear section of the embedded waveguides that is connected to a first ring waveguide of the wavelength tuner. The first ring waveguide is connected to a second ring waveguide via another linear section of the embedded waveguides which is, of course, connected through yet another linear section of the embedded waveguides to the loop reflector of the wavelength tuner. Therefore, the extended cavity beyond the backend includes a linear section of the embedded waveguides, a first ring waveguide, another linear section of the embedded waveguides, a second ring waveguide, yet another linear section of the embedded waveguides, and a loop shape reflector made from Si and/or SiN. The first ring, the second ring, and the loop reflector optionally are all part of the embedded waveguides.

Moreover, the method includes a step of measuring power of light right in front of the reflector by the photodiode to monitor output power of laser out of the front end. The step takes advantage of a fixed correlation between the measured power of light in front of the reflector in the wavelength tuner and the output power of the laser at frontend of the gain chip to give accurate power monitoring of the output power of the silicon-photonics-based laser device. Since the photodiode is disposed right in front of the reflector in the wavelength tuner, it effectively is disposed inside the laser cavity which is extended from the backend of gain chip. The power monitored by the photodiode disposed inside the laser cavity has a fixed ratio with the output power of the laser at its frontend output port. The fixed ratio is substantially independent from any variations in laser-to-Si coupling loss and waveguide loss in wavelength tuner.

One major advantage of disposing a power monitor inside laser cavity is simplification in laser device packaging process. For the silicon-photonics-based laser device, the monitor photodiode according to the present invention can be placed directly inside a laser oscillation cavity right before a reflector mirror, removing requirement of adding extra power splitter outside the frontend output port. Also, the correlation between the output power and monitor photodiode current is very stable and insensitive to the device loss or device degradation. In fact, the correlation between the monitor photodiode disposed inside the laser cavity and output power is only decided by the laser cavity mirror reflectivity which can be manufactured with high precision in a matured CMOS process. Performance of this power monitor for the silicon-photonics-based laser device can be very stable and precise.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A laser device based on silicon photonics with in-cavity power monitor comprising:
a gain chip mounted on a silicon photonics substrate and configured to emit light from an active region bounded between a frontend facet and a backend facet;
a loop reflector configured to reflect the light in a cavity formed between the loop reflector and the frontend facet through which a laser light is output; and
a photodiode directly coupled to a splitter disposed in an optical path between the loop reflector and a component positioned in the cavity, the photodiode being configured to measure at or in proximity to the loop reflector power of light propagating through the cavity between the loop reflector and the component.

2. The laser device of claim 1 wherein the photodiode is positioned in the cavity adjacent to the splitter.

3. The laser device of claim 1 wherein the photodiode is configured to measure the power of the light between the loop reflector and the component before being output from the laser device through the frontend facet.

4. The laser device of claim 1 wherein the photodiode is configured to measure the power of the light at a location proximate to the loop reflector.

5. The laser device of claim 1 wherein:
the front facet is partially reflective;
the backend facet is anti-reflective; and
the loop reflector has a higher reflectivity than the frontend facet.

6. The laser device of claim 1 wherein the photodiode is configured to measure the power of the light propagating from the loop reflector to the component.

7. The laser device of claim 1 wherein the photodiode is configured to measure the power of the light propagating from the loop reflector to the component at a location proximate to the loop reflector.

8. The laser device of claim 1 wherein the photodiode is configured to measure the power of the light propagating from the component to the loop reflector.

9. The laser device of claim 1 wherein the photodiode is configured to measure the power of the light propagating from the component to the loop reflector at a location proximate to the loop reflector.

10. The laser device of claim 1 wherein the loop reflector is configured to mirror light into the cavity.

11. The laser device of claim 1 wherein the photodiode is configured to monitor an output power of the laser light output from the frontend facet based on a correlation between the power measured by the photodiode at or in proximity to the loop reflector and the output power of the laser device at the frontend facet.

12. The laser device of claim 11 wherein the correlation is independent of coupling loss between the gain chip and the silicon photonics substrate.

13. The laser device of claim 11 wherein the correlation is independent of device losses in the gain chip and the silicon photonics substrate.

14. The laser device of claim 11 wherein the correlation depends on reflectivity values of the frontend facet and the loop reflector.

15. The laser device of claim 1 wherein the component is a wide-band tuner configured to tune wavelength over entire C band or O-band.

16. The laser device of claim 1 wherein the component is a wavelength tuner configured to generate an interference spectrum with a center wavelength and suppressed side modes over a wide-band tunable range.

17. The laser device of claim 1 wherein the component is an optical filter.

18. The laser device of claim 1 wherein the component is a silicon photonics component.

* * * * *